United States Patent [19]

Poh et al.

[11] Patent Number: 5,796,246
[45] Date of Patent: Aug. 18, 1998

[54] TEST BOARD AND PROCESS OF TESTING WIDE WORD MEMORY PARTS

[75] Inventors: Looi Choon Poh; Goh Meng Kiang; Chen Teck Liong; Thiang Nan Guan; Abu Bakar, all of Singapore, Singapore

[73] Assignee: Texas Instruments Incorporated, Dallas, Tex.

[21] Appl. No.: 654,657

[22] Filed: May 29, 1996

[51] Int. Cl.⁶ .................................................. G01R 31/02
[52] U.S. Cl. ............... 324/73.1; 324/760; 365/201; 371/21.1
[58] Field of Search ................ 324/73.1, 158.1, 324/760, 765; 365/200, 201, 63, 193; 371/21.1, 21.6, 21.2

[56] References Cited

U.S. PATENT DOCUMENTS 4,975,641  12/1990  Tanaka et al. ................ 324/73.1
5,132,614  7/1992  Sakumoto et al. ............ 324/73.1
5,436,910  7/1995  Takeshima et al. ........... 365/201

*Primary Examiner*—Ernest F. Karlsen
*Assistant Examiner*—Anh Phung
*Attorney, Agent, or Firm*—Lawrence J. Bassuk; Richard L. Donaldson

[57] ABSTRACT

Wide word memory parts (608) are tested in a design for test "DFT" mode at elevated temperatures. The parts are mounted on test boards (600) and only the set of data I/O leads 0–3 active in the "DFT" mode, which is less than the total number of data I/O leads 0–15, connect to substrate terminals (604) that connect to tester receivers. This provides for using existing test equipment with only a change in the test boards (600) while obtaining a higher efficiency in testing a larger number of memory parts than if all the data I/O leads were connected to the receivers.

4 Claims, 5 Drawing Sheets

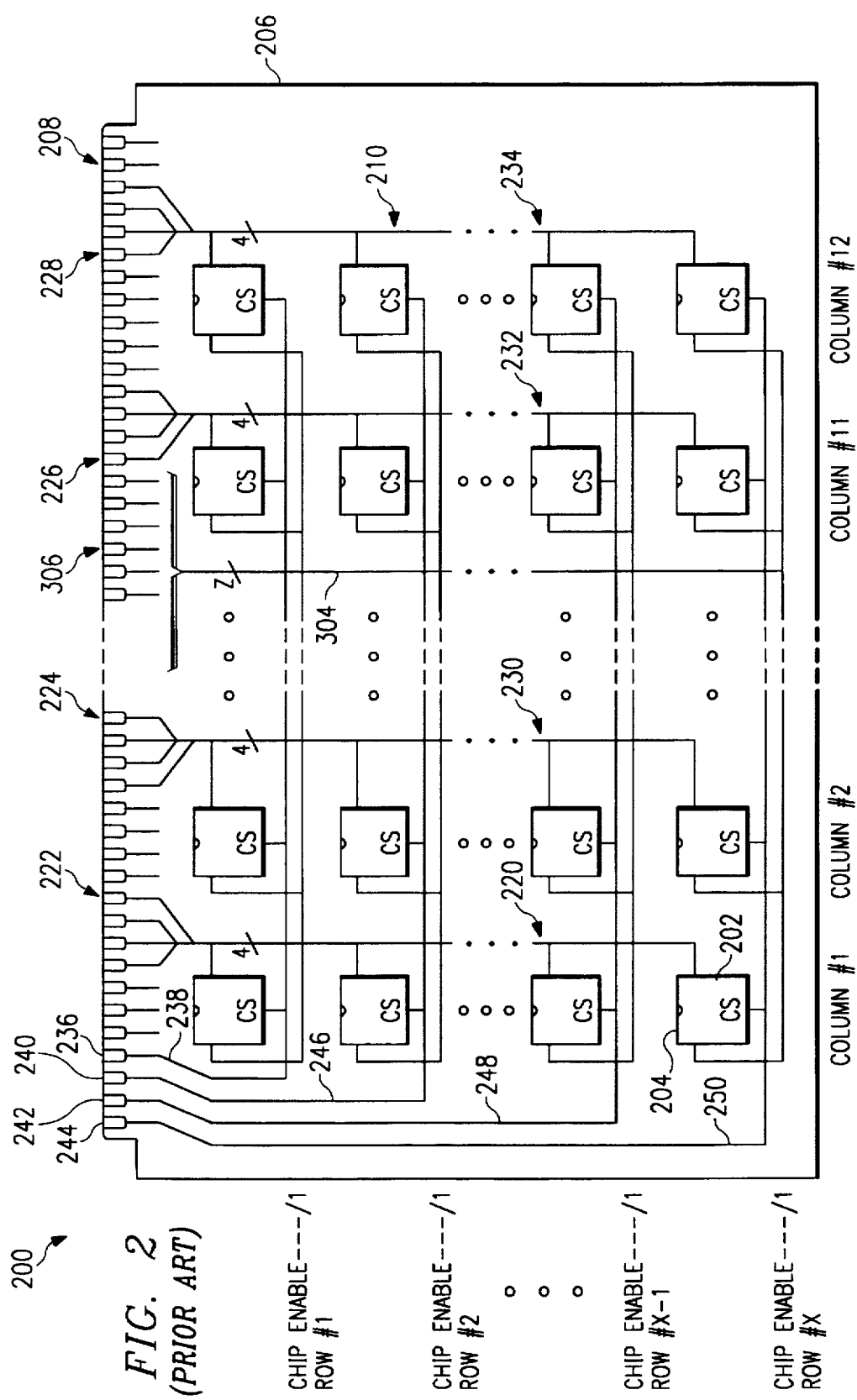

TEST BOARD AND PROCESS OF TESTING WIDE WORD MEMORY PARTS

CROSS REFERENCE TO RELATED APPLICATIONS

The disclosure in this application is related to the disclosure in application No. 08/838.112, pending.

1. Field of the Invention

This invention relates generally to testing memory parts and particularly relates to testing dynamic random access memory DRAM parts having wide word input and output of data, typically of sixteen bits in a data word and greater.

2. Description of the Related Art

Manufacture of DRAM and other memory parts includes design of electronic circuits, fabrication and processing of silicon wafers, packaging individual chips and testing the parts.

Testing presents a major part of manufacturing integrated circuits generally and memory parts particularly; the parts must be tested to insure reliability for many years. Testing memory parts consumes a lot of time in the manufacturing process because of the large arrays of memory cells on each part. Commercially available DRAMs typically have over four million storage locations or memory cells in a part and designs exist for parts having 256 million memory cells in a part. Insuring reliability requires testing each memory cell several times at multiple test points along the manufacturing process.

Previously DRAM parts had either one or four data input and output (I/O) leads for writing and reading data. These parts were referred to as being "by 1, x1" or "by 4, x4", with the number referring to the number of data I/O leads. Some parts had more data I/O leads, but they were of small volume and not a large part of the market.

Recently wide word DRAM parts having sixteen data I/O leads in a part have become a major part of the market. The phrase "wide word" comes from computer terminology and refers to the relative number of data bits that occur in a data word. Thus, sixteen data bits being read from and written to a DRAM at one time is much wider than four data bits at one time. The same increase in data I/O leads also has occurred in other memory parts such as static and non-volatile memory parts.

In production testing, each I/O lead must be connected to a receiver on a test head of a batch tester test machine. The batch tester receiver supplies data signals and interprets the data signals output from the data lead to which it is connected and determines whether a pass or a fail has occurred. With DRAM parts having sixteen I/O leads, sixteen receivers are required to test a single DRAM part. A major problem is that test machines have limited numbers of receivers. Existing machines can perform the required testing but with low throughput. In order to increase capacity, more machines must be purchased. Additional receivers typically are not added to existing machines. Testing wide word DRAM parts with existing arrangements of the test machines thus requires buying additional test machines or systems to increase capacity. This increases the cost of testing and increases the cost of making wide word DRAM parts.

Some reductions in test cost have been realized by designing circuits into the DRAM parts to facilitate testing. These circuits have been referred to as DFT or design for test circuits. The DFT circuits operate by conducting some or much of the testing in parallel inside the DRAM part with test results occurring on fewer than all of the data I/O leads. DFT testing occurs by placing a DRAM parts in a special DFT mode effected by applying nonstandard or over-voltages on certain leads of the DRAM part. On present sixteen data lead I/O DRAM parts, DFT results occur on four, two or more of the sixteen data I/O leads.

SUMMARY OF THE INVENTION

In accordance with the invention, gross, low cost, batch testing of memory parts having wide word data I/O leads occurs by connecting only the set of data I/O leads active in a design for test mode to the batch tester test head receivers. The remaining data I/O leads, those inactive in the design for test mode, are left unconnected to the receivers.

In particular, the memory parts are mounted on test boards in arrays of rows and columns. In each column, the sets of data I/O leads active in the design for test mode of each memory part are connected to like sets of data I/O leads of the other memory parts in that column and to data I/O terminals on the test board. In each row, the chip select or output enable lead of each memory part is connected to the chip select or output enable leads of all the other memory parts in that row and to a chip select or output enable terminal on the test board. There are plural chip select or output enable terminals on the test board, one for each row.

The memory parts are then placed in the design for test mode and gross testing of the parts occurs in the design for test mode on a row by row basis. This gross testing is particularly useful to determine failing memory parts in a test occurring at elevated temperature.

The test board assembly comprises a substrate, plural sockets, plural terminals, plural memory parts mounted in the sockets and plural substrate leads connecting together the sockets and terminals. The sockets are arranged on the substrate in an array of rows and columns with each socket having plural leads for carrying signals.

The terminals carry plural address signals, a row address strobe signal, at least one column address strobe signal, at least one write signal, plural chip select or output enable signals and plural data I/O signals. The data I/O signals are arranged in groups; there is one group of data I/O signals for each column of sockets and there are the same number of data I/O terminals and signals in each group.

There is one memory part in each socket. The memory parts are of like design and each memory part has leads carrying plural address signals, a lead carrying a row address strobe signal, at least one lead carrying a column address strobe signal, at least one lead carrying a write signal, one lead carrying a chip select or output enable signal and plural leads carrying data I/O signals. Each memory part has a normal operating mode in which all of the leads carrying data I/O signals are active and a design for test mode in which a set of data I/O leads less than all of the leads carrying data I/O signals are active. Each lead of each memory part electrically connects with a corresponding lead of its respective socket.

The substrate leads connect the sockets to the terminals. The substrate leads connect the plural address signals, the row address strobe signal, the at least one column address strobe signal, and the at least one write signal from the terminals to the respective leads of every socket. The substrate leads connect the plural chip select or output enable signals from the terminals to the corresponding lead of each socket in a respective row.

The substrate leads also connect the certain number of data I/O signals in each group to only the set of data I/O leads of each socket in a respective column of sockets. The data I/O leads of each socket, corresponding to the rest of the data I/O leads of each memory part, remain unconnected to the terminals.

A process of testing memory parts comprises providing memory parts with an operating mode in which all data I/O leads are active to access a contained array of storage cells, a design for test mode in which a set of the data I/O leads less than all of the data I/O leads are active to access the contained array of storage cells and a chip select or output enable lead that is active to enable operation of the memory part in both the operating mode and design for test mode.

The process loads the memory parts in arrays of rows and columns on substrates in a batch test machine containing plural substrates.

The process connects only the set of data I/O leads of each memory part in each column to the sets of data I/O leads of the other memory parts in that column and to a group of data I/O terminals on the substrate while leaving the remaining data I/O leads of each memory part unconnected to the remaining data I/O leads of the other memory parts, including providing a separate group of data I/O terminals for each column.

The process connects the chip select or output enable leads of every memory part in each row to the chip select or output enable leads of the other memory parts in that row and to a chip select or output enable terminal on the substrate, including providing a separate chip select or output enable terminal for each row.

The process operates the memory parts in the batch test machine one row at a time in only the design for test mode.

The process includes subjecting the memory parts to increased temperature during the operating step.

The operating step includes operating one row of memory parts on plural substrates at the same time.

BRIEF DESCRIPTION OF THE DRAWING FIGURES

FIG. 2 is an idealized plan view of a test board mounting memory parts having four data I/O leads apiece;

DETAILED DESCRIPTION

Figure 1:
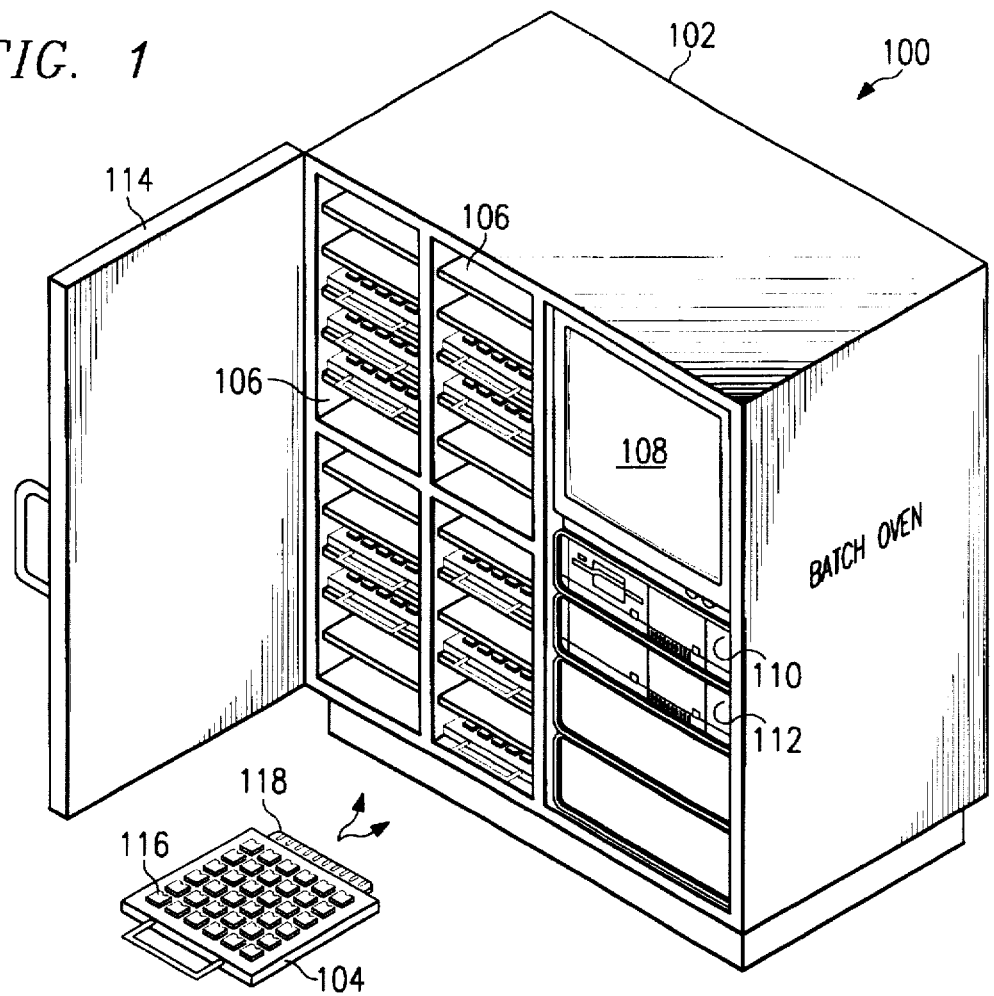
FIG. 1 is a perspective view of a batch test machine containing multiple test boards.

In FIG. 1, batch test machine 100 comprises a cabinet 102 enclosing plural test boards 104 arranged in two cavities 106, a monitor 108 and controllers 110 and 112. Batch test machine 100 includes a door 114 that can be pivoted to close cavity 106.

Test board 104 mounts memory parts 116 in an array of rows and columns. Electrical connections to the memory parts occurs over terminals 118 on test board 104. When closed, cavity 106 and the plural test boards contained in the cavity can be heated to test the mounted memory parts at increased temperatures. Typically the test boards have the memory parts mounted with automated equipment and the test boards can be manually mounted in the cavity 106 of test machine 100.

Test machine 100 provides a gross, low cost test of a batch of many memory parts with one test setup.

Figure 3:
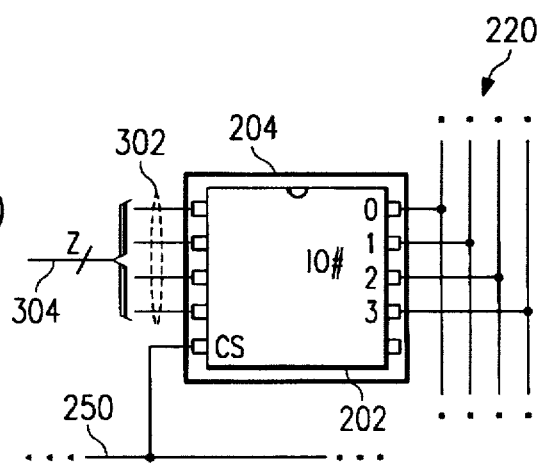
FIG. 3 is an idealized block diagram of a memory part used in FIG. 2 and having four data I/O leads active in an operating mode.

In FIGS. 2 and 3, test board 200 mounts memory parts 202 in sockets 204 on a substrate 206. The memory parts and sockets are arranged in rows 1 through X and columns 1 through 12. Other arrangements can occur depending on the number of receivers available. There are as many rows of parts and sockets as available space on the test board 200 will allow.

The memory parts are all of like design and each memory part has four data I/O leads 0, 1, 2 and 3 and one chip select or output enable lead CS or OE. The memory parts also have a number U of leads 302 for receiving address signals, a row address strobe signal, a column address strobe signal and a write signal, according to known standard designs. There can be as many leads 302 as are necessary to provide the signals for the memory parts.

The board 200 also comprises terminals 208 formed on substrate 206 and substrate leads 210 connecting selected leads of the sockets to selected terminals. The four data I/O leads 0, 1, 2 and 3 of each memory part in column 1 are connected to the respective data I/O leads of every other part in column 1 by four substrate leads 220 and to four respective data I/O terminals 222. In a like manner all of the data I/O leads of memory parts in columns 2 through 12 are connected to data I/O terminals 224 through 228 by substrate leads 230 through 234. The board 200 also carries a number Z of substrate leads 304 connecting the leads 302 from all the memory parts on the board 200 to a group of terminals 306. The leads 304 and terminals 306 carry the address, row address strobe RAS, column address strobe CAS and write signals to all the memory parts.

The number of columns on a test board is limited by the number of batch tester test head receivers available for connection to each test board. In the arrangement of FIG. 2, there are a total of forty-eight data I/O substrate leads and terminals, four for each of twelve columns of memory parts. These forty-eight terminals connect to forty-eight receivers in test machine 100. Thus with forty-eight receivers available for each test board, each test board can accommodate twelve columns of memory parts having four data I/O leads apiece.

In row 1, the chip select or output enable leads CS or OE of all the memory parts connect together and to chip select or output enable terminal 236 by substrate leads 238. In a like manner, all of the chip select or output enable leads CS or OE of the memory parts in each row connect to the other chip select or output enable leads of the parts in that row and to a respective chip select or output enable terminal 240, 242 and 244 by a respective substrate lead 246, 248 and 250.

When the chip select or output enable lead for a memory part is inactive, its data I/O leads are in a high impedance state so they do not influence signals carried by the substrate data I/O leads 220, 230, 232 and 234, according to known design. An active state chip select or output enable signal causes the data I/O leads of the memory part to drive the associated substrate data I/O leads.

Thus each row of memory parts can be tested in test machine 100 by activating one chip select or output enable terminal of each test board at a time and reading and writing data signals to each memory part in that row. The arrangement of FIGS. 2 and 3 represent a known implementation of typical memory parts currently available. The memory parts are not considered wide parts because they have only four bits or four leads of data I/O.

Figure 4:
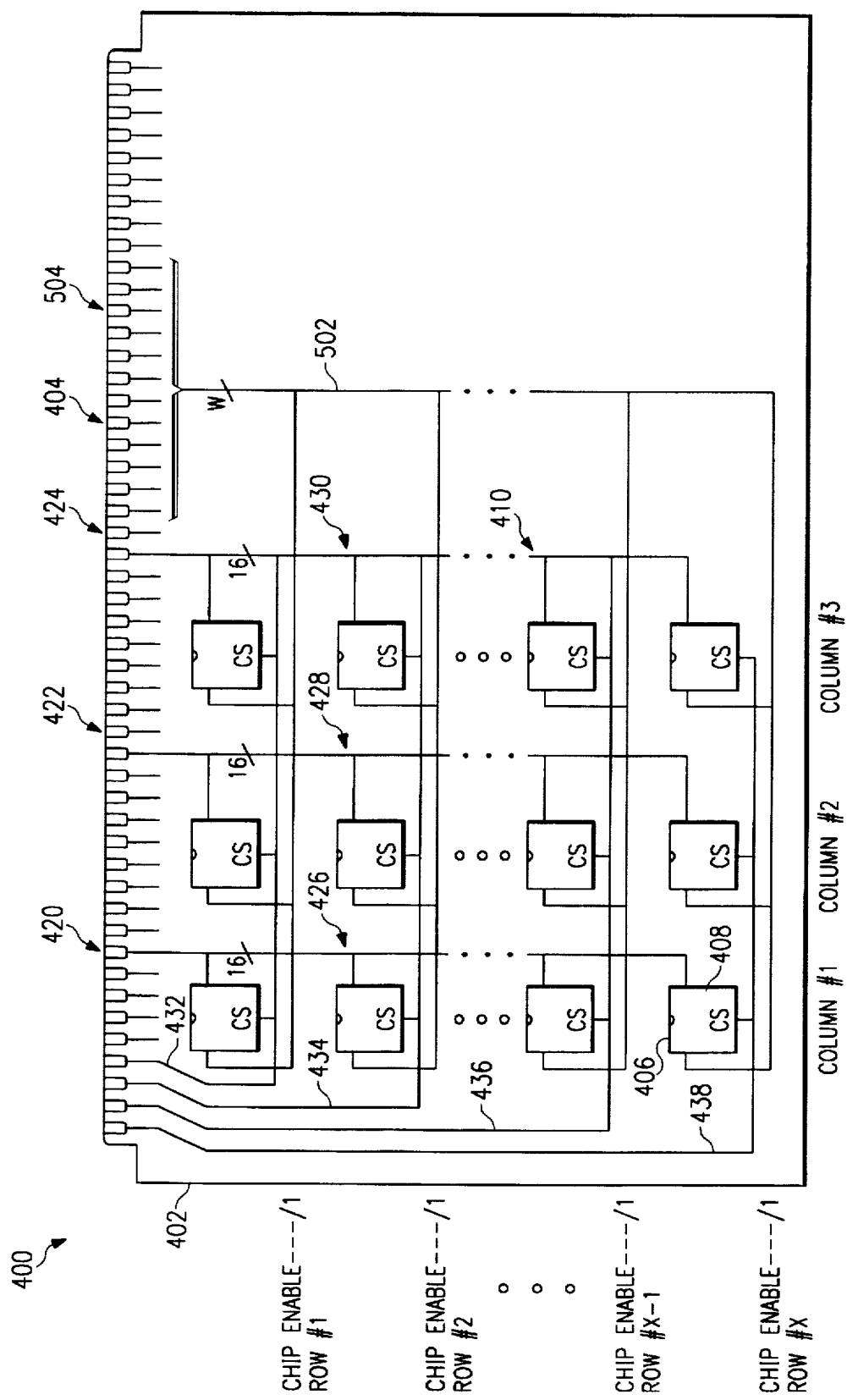
FIG. 4 is an idealized plan view of a test board mounting memory parts having sixteen data I/O leads apiece.
Figure 5:
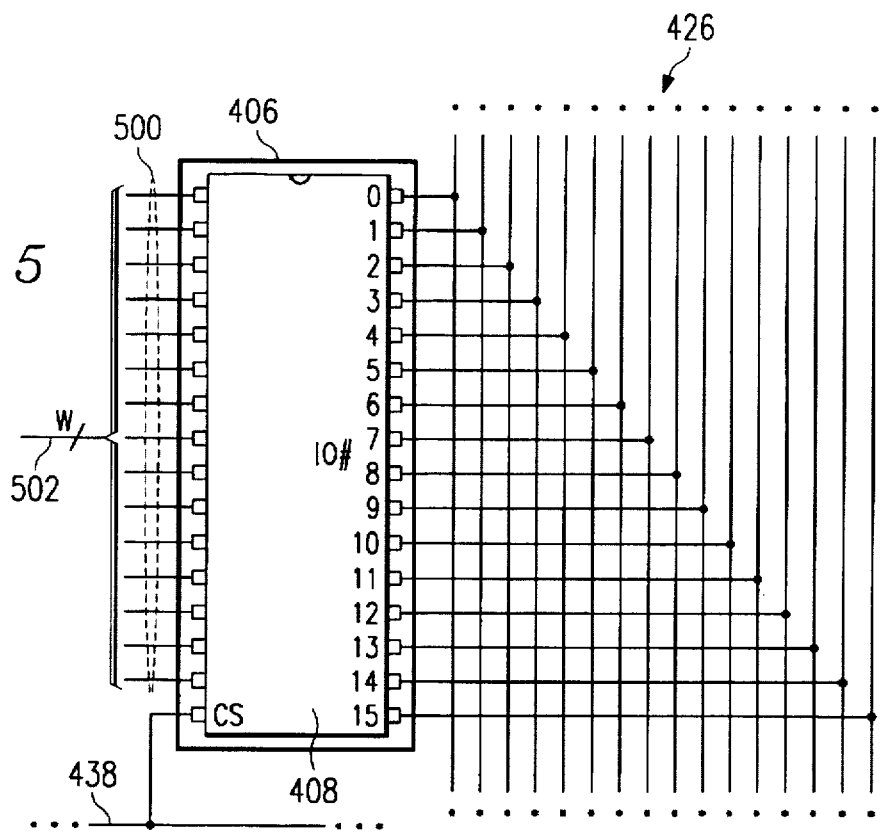
FIG. 5 is an idealized block diagram of a memory part used in FIG. 4 and having sixteen data I/O leads active in an operating mode.

An example of an undesired and expensive solution to the testing of wide word memory parts is depicted in FIGS. 4 and 5. In this example, the memory parts have sixteen data I/O leads apiece. With the same total of forty-eight receivers available for connection to the data I/O terminals of each test board, as were available in the example of FIGS. 2 and 3, only three columns of memory parts can be accommodated.

In FIGS. 4 and 5, test board 400 comprises substrate 402 carrying terminals 404, sockets 406, memory parts 408 and substrate leads 410. The sixteen data I/O leads 0–15 of the memory parts in each column connect to respective groups of terminals 420, 422 and 424 across respective substrate leads 426, 428 and 430. There are sixteen terminals in each of groups of terminals 420, 422 and 426 and there are sixteen substrate leads in each of substrate leads 426, 428 and 430. Each of the four depicted rows have individual chip select or output enable leads 432, 434, 436 and 438 that connect to the chip select or output enable leads CS OR OE of each memory part in that row. The memory parts 408 also have leads 500 carrying address, RAS, CAS and write signals. These leads 500 connect to a number W of substrate leads 502 that connect to terminals 504. Substrate leads 502 carry these signals from the terminals 504 to all the memory parts on the board 400.

Figure 7:
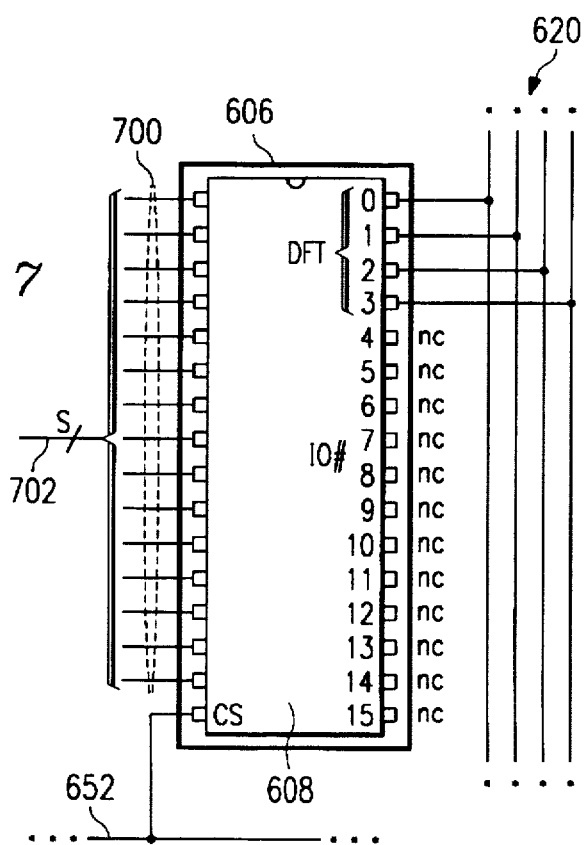
FIG. 7 is an idealized block diagram of a memory part used in FIG. 6.
Figure 6:
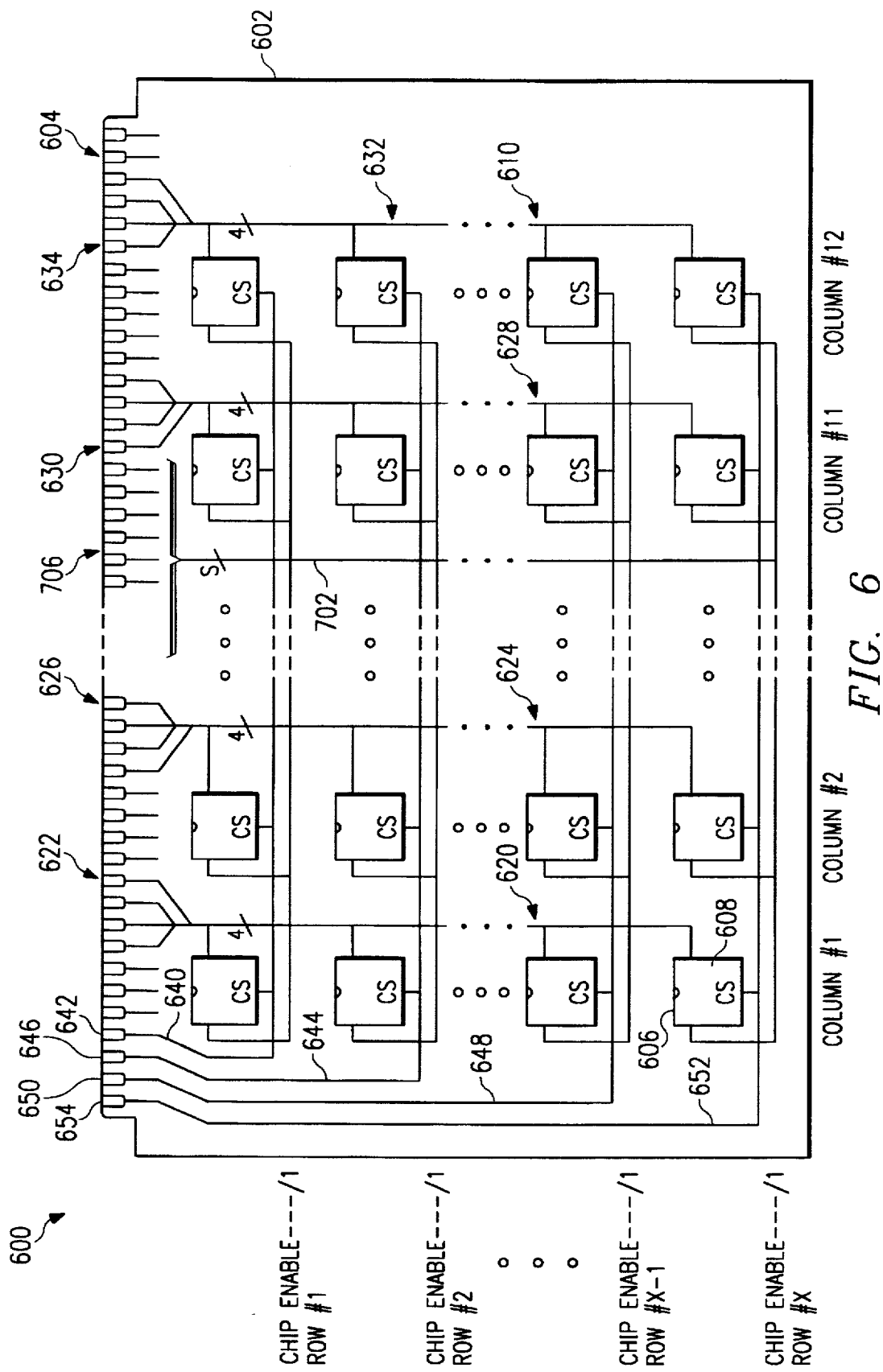
FIG. 6 is an idealized plan view of a test board of the invention mounting memory parts having sixteen data I/O leads and having a design for test mode in which only four or two or one data I/O leads are active.

In FIGS. 6 and 7, test board 600 comprises substrate 602 carrying terminals 604, sockets 606, memory parts 608 and substrate leads 610. The memory parts 608 and sockets 606 are arranged in an array of X rows and twelve columns.

Memory parts 608 have a normal operating mode in which all of the data I/O leads 0–15 are active to access all of the contained arrays of memory cells when the chip select or output enable lead CS or OE is active. The memory parts 608 also have a design for test "DFT" mode in which a set of the data I/O leads less than all of the data I/O leads are active to access all of the contained arrays of memory cells when the chip select or output enable lead CS or OE is active. Typically this set of I/O leads active in the DFT mode is leads 0–3. Future memory parts should also have such DFT modes with a similar set of leads active in that mode.

Although shown to facilitate explanation of the invention, the memory parts also have address leads receiving address signals, a row address strobe lead, at least one column address strobe lead 700, and at least one write lead occurring on leads designated by industry standards. A typical memory part having sixteen operating data I/O leads can typically have forty-two leads. The leads 700 connect to a number S of substrate leads 702 that connect to terminals 706. Substrate leads 702 carry the address, RAS, CAS and write signals from the terminals 706 to all the memory parts on the board 600.

Again, the test board is limited in the number, a total of forty-eight, of batch tester test head receivers available for connection to terminals 604. By connecting only the sets of data I/O leads active in the DFT mode to the terminals, the test board can carry twelve columns of memory parts and as many rows of memory parts as space on the test board allows. This maximizes the number of memory parts that can be tested at elevated temperatures at one time. The tests that can be conducted in this arrangement are limited to those tests available in DFT mode, but those DFT mode tests remain necessary at some point in the manufacturing process and the arrangement of the invention efficiently fulfills that need. This arrangement obtains testing of four times the number of memory parts that can be tested by connecting all of the data I/O leads to the terminals and receivers. The present arrangement also provides for maximizing usage of existing test equipment by simply changing the test boards.

The set of active data I/O leads 0–3 in the DFT mode of each memory part in column 1 are connected together by four respective substrate leads 620 that also connect to a group of terminals 622.

In a like manner, the set of active data I/O leads 0–3 in the DFT mode of each memory part in column 2 are connected together by four respective substrate leads 624 that also connect to a group of terminals 626. The set of active data I/O leads 0–3 in the DFT mode of each memory part in column 11 are connected together by four respective substrate leads 628 that also connect to a group of terminals 630. The set of active data I/O leads 0–3 in the DFT mode of each memory part in column 12 are connected together by four respective substrate leads 632 that also connect to a group of terminals 634.

The chip select or output enable leads CS or OE of all the memory parts in row 1 are connected together by substrate lead 640 that also connects to a chip select or output enable substrate terminal 642. The chip select or output enable leads CS or OE of all the memory parts in row 2 are connected together by substrate lead 644 that also connects to a chip select or output enable substrate terminal 646. The chip select or output enable leads CS or OE of all the memory parts in row X-1 are connected together by substrate lead 648 that also connects to a chip select or output enable substrate terminal 650. The chip select or output enable leads CS or OE of all the memory parts in row X are connected together by substrate lead 652 that also connects to a chip select or output enable substrate terminal 654.

The application may be practiced other than as specifically described. For example, memory parts having data I/O leads numbering more than sixteen, such as thirty-two or sixty four, can use this invention to advantage in using present test equipment. The location of the data I/O leads on the packages of the memory parts can change while remaining within the scope of the appended claims.

We claim:

1. A test board assembly comprising:
   a. a substrate;
   b. plural sockets mounted on the substrate, the sockets being arranged on the substrate in an array of rows and columns, each socket having plural leads for carrying signals;
   c. plural terminals formed on the substrate, the terminals carrying plural address signals, a row address strobe signal, at least one column address strobe signal, at least one write signal, plural chip enable signals and plural data I/O signals, the data I/O signals being arranged in groups, there being one group of data I/O signals for each column of sockets and there being the same number of data I/O terminals and signals in each group;
   d. plural memory parts mounted in the sockets, one memory part in each socket, the memory parts being of like design and each memory part having leads carrying plural address signals, a lead carrying a row address strobe signal, at least one lead carrying a column address strobe signal, at least one lead carrying a write signal, one lead carrying C chip enable signal and plural leads carrying data I/O signals, each memory part having a normal operating mode in which all of the leads carrying data I/O signals are active and a design for test mode in which a set of data I/O leads less than all of the leads carrying data I/O signals are active, each lead of each memory part electrically connecting with a corresponding lead of its respective socket; and e. substrate leads carried on the substrate connecting the sockets to the terminals, the substrate leads connecting the plural address signals, the row address strobe signal, the at least one column address strobe signal, and the at least one write signal from the terminals to the respective leads of every socket, the substrate leads connecting one of the plural chip enable signals from the terminals to the corresponding lead of each socket in a row and the substrate leads connecting the certain number of data I/O signals in each group to only the set of data I/O leads of each socket in a respective column of sockets, the data I/O leads of each socket corresponding to the rest of the data I/O leads of each memory part remaining unconnected to the terminals.

2. A process of testing memory parts comprising:

a. providing memory parts with an operating mode in which all data I/O leads are active to access a contained array of storage cells, a design for test mode in which a set of the data I/O leads less than all of the data I/O leads are active to access the contained array of storage cells and a chip select or output enable lead that is active to enable operation of the memory part in both the operating mode and design for test mode;

b. loading the memory parts in arrays of rows and columns on substrates in a batch test machine containing plural substrates;

c. connecting only the set of data I/O leads of each memory part in each column to the sets of data I/O leads of the other memory parts in that column and to a group of data I/O terminals on the substrate while leaving the remaining data I/O leads of each memory part unconnected to the remaining data I/O leads of the other memory parts, including providing a separate group of data I/O terminals for each column;

d. connecting the chip select or output enable leads of every memory part in each row to the chip select or output enable leads of the other memory parts in that row and to a chip select or output enable terminal on the substrate, including providing a separate chip select or output enable terminal for each row; and e. operating the memory parts in the batch test machine on row at a time in only the design for test mode.

3. The process of claim 2 including subjecting the memory parts to increased temperature during the operating step.

4. The process of claim 2 in which the operating includes operating one row of memory parts on plural substrates at the same time.

* * * * *